United States Patent [19]

Kosonocky et al.

[11] 4,211,936
[45] Jul. 8, 1980

[54] CCD GATE ELECTRODE STRUCTURES AND SYSTEMS EMPLOYING THE SAME

[75] Inventors: Walter F. Kosonocky, Skillman; Donald J. Sauer, Plainsboro, both of N.J.

[73] Assignee: RCA Corporation, New York, N.Y.

[21] Appl. No.: 916,208

[22] Filed: Jun. 16, 1978

[51] Int. Cl.² .................. G11C 19/28; H03K 5/00; H01L 29/78
[52] U.S. Cl. .................. 307/221 D; 307/238; 357/24; 365/183
[58] Field of Search ............. 357/24; 307/221 D, 238; 365/183

[56] References Cited

U.S. PATENT DOCUMENTS

| | | | |
|---|---|---|---|
| 3,811,055 | 5/1974 | Weimer | 357/24 |
| 3,873,851 | 5/1974 | Weimer | 357/24 |
| 3,902,186 | 8/1975 | Engeler et al. | 357/24 |
| 3,967,254 | 6/1976 | Kosonocky et al. | 357/24 |
| 3,971,003 | 7/1976 | Kosonocky | 357/24 |
| 4,103,347 | 7/1978 | Barton | 307/221 D |
| 4,134,028 | 1/1979 | Kosonocky et al. | 357/24 |

*Primary Examiner*—Gene M. Munson
*Attorney, Agent, or Firm*—Samuel Cohen; H. Christoffersen

[57] ABSTRACT

A gate electrode which is common to at least two CCD channels is formed with a "window" over one of the channels. A second gate electrode over the first controls the substrate potential of the one channel through the window but has no effect on the substrate potential of the other channel. The structure makes it possible to block or delay the propagation of charge in one channel relative to the other and is useful, for example, in structures for parallel-to-serial charge signal translation and vice versa.

16 Claims, 16 Drawing Figures

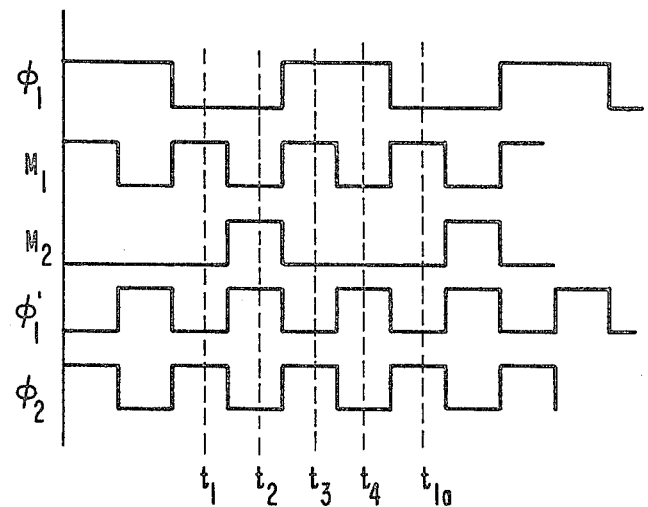
Fig. 4.
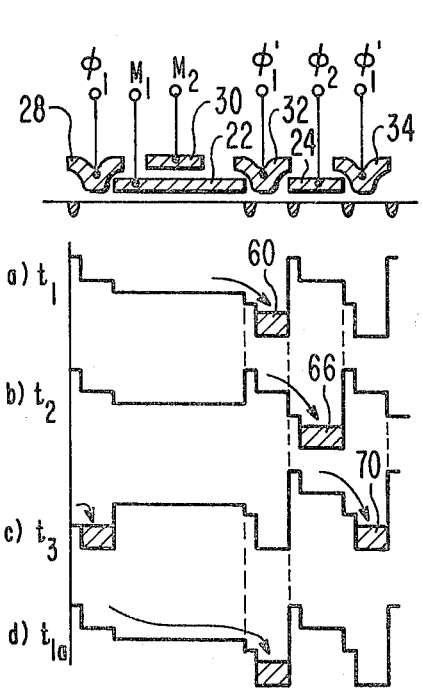
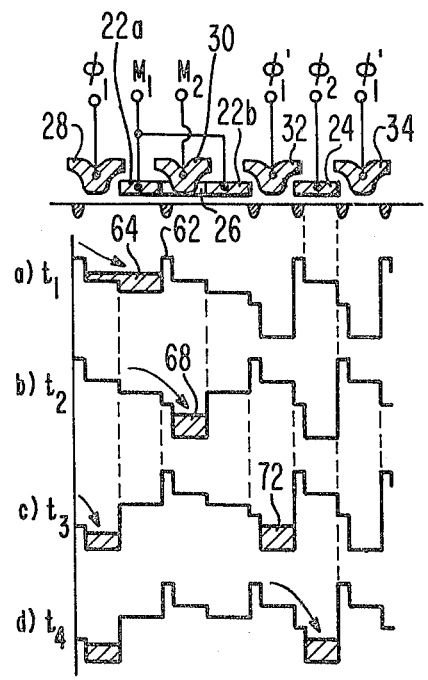
Fig. 5.   Fig. 6.

CCD GATE ELECTRODE STRUCTURES AND SYSTEMS EMPLOYING THE SAME

The invention described herein was made under a contact with the Department of the Navy.

This invention relates to charge coupled devices (CCD's) and, in particular, to the control of the propagation of charge in such devices.

There are many applications in which it is necessary differentially to control the flow of charge in a plurality of CCD channels. Some examples include networks for parallel-to-serial conversion and vice versa, some forms of readout circuits for CCD memories, some forms of readout circuits for CCD imagers, networks for decoding and multiplexing of CCD channels, and so on. The present application describes a number of relatively simple structures designed to meet this need.

In the drawing:

FIG. 1 is a plan view of a parallel-to-serial converter embodying the invention;

FIGS. 2 and 3 are sections taken along lines 2—2 and 3—3, respectively, of FIG. 1, and substrate potential profiles illustrating the system operation;

FIG. 4 is a drawing of waveforms employed in the operation of the system of FIG. 1;

FIGS. 5 and 6 show surface potential profiles which illustrate the operation of a modified form of the system of FIG. 1;

Figure 1:
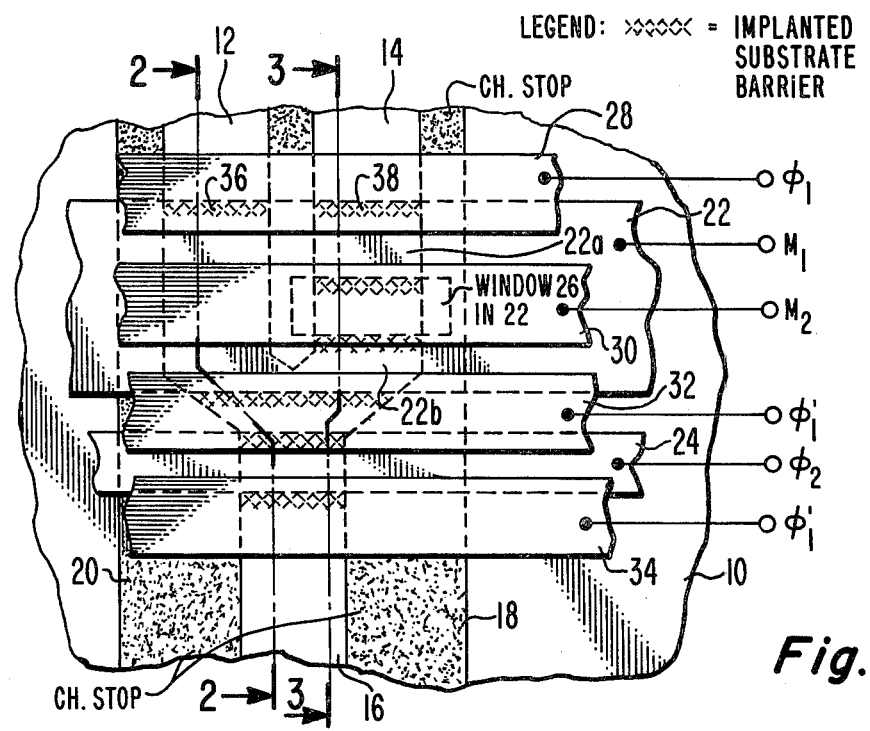

For purposes of the discussion which follows, it is assumed that the various CCD's illustrated are surface-channel, P-type substrate (N channel) structures. It is to be understood, however, that this is merely illustrative as the inventive teachings also are applicable to P-channel, surface channel devices and to buried channel devices. The various electrodes are insulated from the substrate by an insulating material such as silicon dioxide. To simplify the drawing, the insulation is indicated in the cross-sectional views by spacing rather than by showing cross-hatched regions. Also, while the invention is illustrated in simplified form, wherever possible (for example, FIG. 1 shows only two input CCD channels and one output CCD channel), it is to be understood that it is applicable to much more complex systems. To give but one example, the teachings would be applicable to the translation of four or eight or sixteen or more parallel charge signals to serially-occurring charge signals and vice versa.

The parallel-to-serial converter system of FIG. 1, sometimes termed a multiplexer, includes a P-type substrate 10, two input CCD channels 12 and 14, and an output CCD channel 16. The CCD channels are defined by channel-stops such as 18 and 20, which are formed by P-type silicon which is more highly doped than the P-type substrate 10, as is well understood in the art.

By way of illustration, the electrodes may be assumed to be formed of polysilicon and they include so-called first and second levels of polysilicon. Only those electrodes of interest in the operation are illustrated. The first (lower) polysilicon level includes a relatively wide electrode 22 and another electrode 24. Electrode 22 is formed with an opening 26 therein, hereafter termed a "window". This window is roughly centrally located in electrode 22 and is located over channel 14. There is no window formed in electrode 22 over channel 12. The second (upper) polysilicon level includes electrodes 28, 30, 32 and 34. Electrode 28 serves as an input electrode for the converter and overlaps the electrode 22. Electrode 32 overlaps the edges of electrodes 22 and 24 and electrode 34 is the final electrode illustrated. Electrode 30 lies over electrode 22 and, in particular, over the window in electrode 22. This electrode controls the substrate potential of CCD channel 14 beneath the window.

The system of FIG. 1 employs asymmetrical potential wells to assure unidirectional charge propagation. Such wells are created by doped regions such as 36 and 38. These regions, which are of the same conductivity as the substrate, are doped somewhat more heavily than the substrate and may be formed in the substrate by ion implantation, for example.

Figure 2:
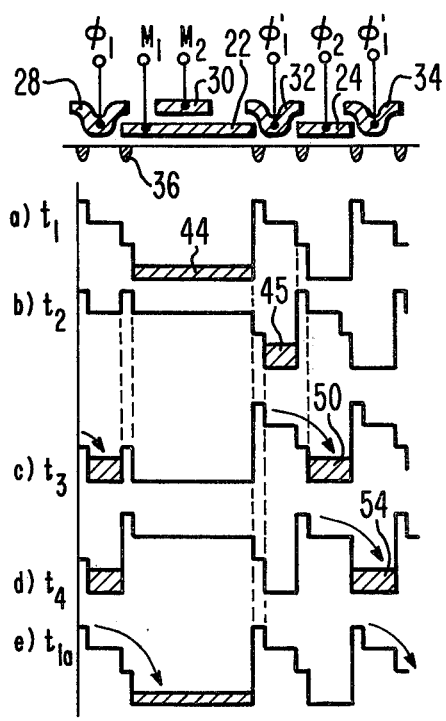
Figure 3:
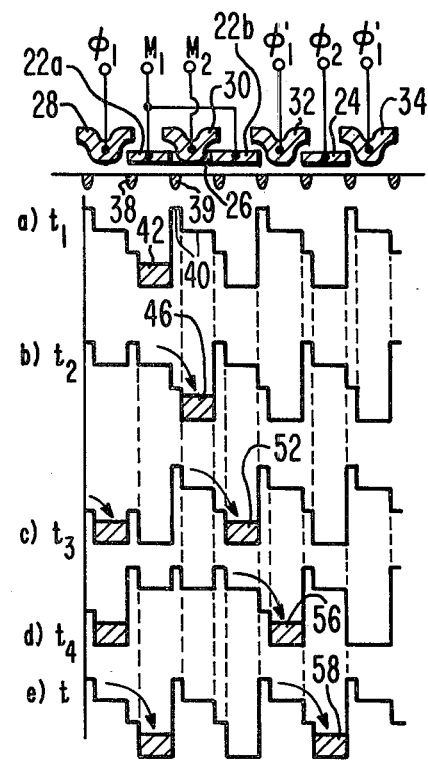

The operation of the converter of FIG. 1 is depicted in FIGS. 2 and 3. These figures and the waveform diagram of FIG. 4 should be referred to in the explanation which follows.

Assume to start with, that charge is present beneath electrode 28 in both channels 12 and 14. At time $t_1$, $M_1$ is high and $\phi_1$ is low. In channel 12 (FIG. 2) the charge formerly present beneath electrode 28 has flowed into the potential well 44 beneath electrode 22 as illustrated at a in FIG. 2. At this same time, $M_2$ is low so that electrode 30 creates a potential barrier beneath the window 26. This barrier is illustrated at 40 in surface potential profile a of FIG. 3 and it is highest beneath the implanted region 39 beneath the window. Accordingly, the charge formerly in the potential well beneath electrode 28 in channel 14 becomes stored in potential well 42 which is located beneath the portion 22a of electrode 22. Electrode region 22a is at the lagging edge of electrode 22, relative to the charge propagation direction.

At time $t_2$, $M_1$ is low, $M_2$ is high and $\phi'_1$ is high. The charge in channel 12 formerly stored in the potential well 44 beneath electrode 22 has transferred to the potential well 45 beneath electrode 32. This is shown at b in FIG. 2. The fact that electrode 30 is relatively positive ($M_2$ is high) at time $t_2$ has no effect on the charge in channel 12 because electrode 22 shields electrode 30 from channel 12. This is shown most clearly in FIG. 2. However, in channel 14 as $M_2$ is high at time $t_2$, electrode 30 creates a potential well 46 in the substrate region beneath window 26. Accordingly, the charge formerly present in potential well 42 has propagated to potential well 46 as shown in FIG. 3. Thus, at time $t_2$, while the charge in channel 14 is stored beneath electrode 30, the charge in channel 12 is stored beneath electrode 32.

At time $t_3$, $\phi_1$, $M_1$ and $\phi_2$ are high while $M_2$ and $\phi'_1$ are low. As electrode 32 has become less positive and as a potential well 50 is now present beneath electrode 24, the charge formerly present in well 45 in channel 12 has moved to potential well 50 in the output channel 16 as shown in FIG. 2, potential profile c. At this same time, as $M_2$ is low and $M_1$ is high, the charge formerly present in potential well 46 of channel 14 has propagated to the potential well 52 beneath the leading edge portion 22b of electrode 22 as shown at c in FIG. 3. Thus, at time $t_3$, the charge from channel 12 is beneath electrode 24, whereas the charge in channel 14 is beneath the electrode portion 22b of electrode 22. As can be seen from FIGS. 2 and 3, at time $t_3$, a new charge signal propagates to the potential wells beneath the first electrode 28.

At time $t_4$, $\phi_1$ remains high and $\phi'_1$ is high and the remaining potentials $M_1$, $M_2$ and $\phi_2$ are low. The result is the propagaton of charge from potential well 50 to potential well 54 beneath electrode 34. This charge is now in the common output channel 16 but is originated in channel 12. At the same time the charge formerly present in potential well 52 beneath electrode portion 22b of channel 14 is now present in potential well 56 beneath electrode 32. Thus, the two charges which previously were in parallel are now sequential charges with the charge from channel 12 reaching the output channel 16 first and followed by the charge in channel 14.

Potential profiles e in FIGS. 2 and 3 occur during a period of operation following the one described above. By this time, the charge in the output channel beneath electrode 34 has propagated to the following electrode (not shown) and the charge formerly present in potential well 56 beneath electrode 32 in channel 14 has propagated to the potential well 58 beneath electrode 24 in the output channel 16. The electrodes following electrodes 24 and 34 may be conventional, two-phase electrodes such as 24 and 34 for propagating the serially-occurring charges in conventional fashion.

The waveforms for $M_1$ and $\phi_2$ in FIG. 4 are identical so that a common generator may be employed. In an alternative form of system the $M_2$ waveform may be made identical to the $\phi'_1$ waveform; that is, the generator of the $\phi'_1$ waveform illustrated may be employed to drive electrode 30 as well as electrodes 32 and 34.

In the embodiment of FIG. 1, the electrode 22 is driven between two voltage levels. FIGS. 5 and 6 illustrate an embodiment in which the electrode 22 is maintained at a positive DC level. In this mode of operation, an implanted region is not required at the lagging edge of electrode 22. In the explanation which follows of this embodiment of the invention, FIGS. 1, 5, 6 and 7 (solid lines) should be referred to. FIG. 5 shows the operation of input channel 12 of FIG. 1 (as modified) and FIG. 6 the operation of input channel 14 of FIG. 1 (as modified).

At time $t_1$, the charge formerly present in the potential well beneath electrode 28 in channel 12 has transferred via the conduction path beneath electrode 22 to the potential well 60 beneath electrode 32. This is shown in FIG. 5. At the same time, as the voltage $M_2$ is relatively low, there is a potential barrier 62 in channel 14 beneath the window 26. Accordingly, the charge formerly present in the potential well beneath electrode 28 has transferred at least in part to the potential well 64 beneath electrode portion 22a of electrode 21 in channel 14.

Note that while the potential of electrode 28 is reduced, there is still some charge storage capacity in the well beneath electrode 28. Whether or not any charge temporarily remains in this well depends upon the DC level $M_1$ and the amount of charge which is present, and other factors. In any case, in due course, all of this charge will transfer at time $t_2$ as discussed shortly.

At time $t_2$, the charge formerly present in potential well 60 in channel 12 has transferred to potential well 66 beneath electrode 24 as illustrated in FIG. 5. This charge therefore is already in the output channel 16. At time $t_2$, the charge formerly in potential well 64 in channel 14 has transferred to potential well 68 beneath the window in channel 14, as illustrated in FIG. 6 at b.

At time $t_3$, the charge formerly present in potential well 66 has transferred to potential well 70 beneath electrode 34 in the output channel 16 as shown at c in FIG. 5. This charge, it will be recalled, originated from input channel 12. At this same time $t_3$, the charge formerly present in potential well 68 has transferred to potential well 72 beneath electrode 32 in the output channel 16. This is shown in FIG. 6 at c. This charge originated in channel 14. Thus, the two parallel charges in channels 12 and 14 are now serially-occurring charges in the output channel 16 with the charge originating in channel 12 arriving at the output channel first and followed by the charge originating in channel 14.

Figure 7:
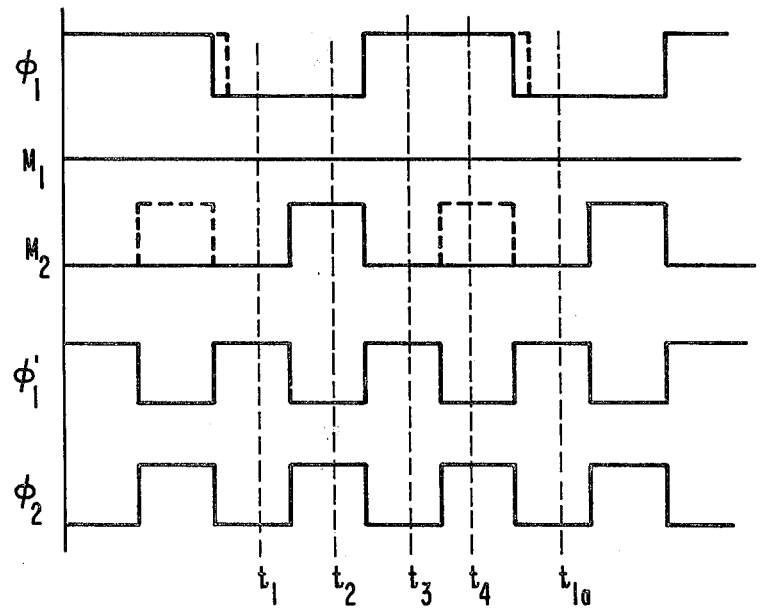
FIG. 7 is a drawing of waveforms employed in the operation of the modified system of FIGS. 5 and 6.

The system just discussed also is operative with the waveforms of FIG. 7 modified as shown by dashed lines in FIG. 7. In this alternative mode of operation, $M_2$ is identical to $\phi_2$ and the wave $M_2$ goes low prior to $\phi_1$ going low.

Figure 8:
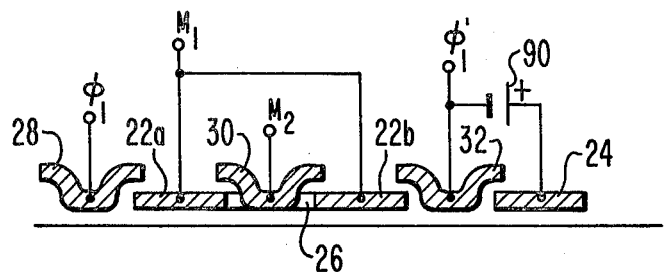
FIG. 8 shows surface potential profiles which illustrate the operation of another modification of the system of FIG. 1.
Figure 8:
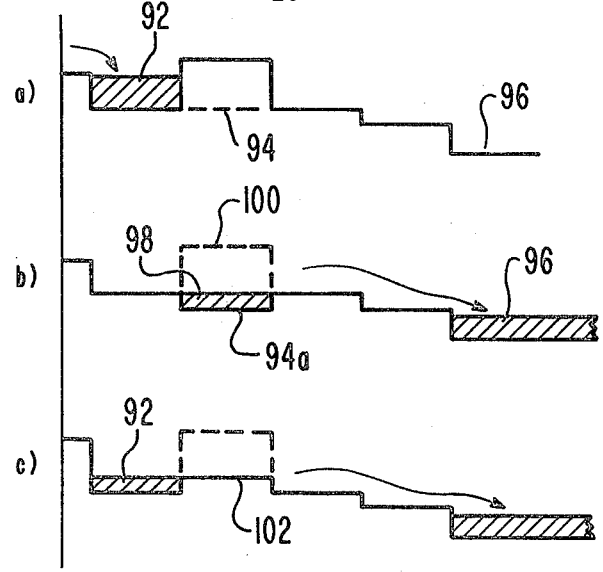

In the embodiments of the invention discussed so far, asymmetrical potential wells are produced by barriers implanted in the substrate at the lagging edge of respective electrodes. There are some constructional advantages in achieving asymmetrical potential wells without requiring implanted barriers. FIG. 8 illustrates a modification of this kind for the branch corresponding to FIG. 6. This corresponds to input channel 14 of FIG. 1. Channel 12 is similarly altered in the sense that no implanted barriers are needed.

In the operation of the embodiment of FIG. 8, it is assumed that electrode 22 is maintained at a DC level $M_1$ just as in the case of FIG. 6. Electrode 24 is driven by the same phase $\phi'_1$ as electrode 32; however, there is a DC offset, indicated by battery 90, between these electrodes to obtain the required potential well asymmetry for unidirectional charge transfer. Substrate potential profile a of FIG. 8 shows the charge stored in potential well 92 beneath electrode 22a. The solid line indicates that $M_2$ is low so that electrode 30 produces a potential barrier through the window and prevents the charge from propagating beyond the window.

If when $M_2$ is made high, the substrate potential 94, indicated by the dashed line, is exactly equal to the substrate potential beneath electrode portions 22a and 22b, the operation is very similar to that which has already been discussed. The charge in well 92 will flow entirely into the potential well 96 beneath electrode 94. In actual operation, however, it is difficult to maintain the channel potential 94 beneath the window at the same value as the surface potential beneath the electrode 22. Therefore, it is desirable to operate either in the mode illustrated at b or in the mode illustrated at c in FIG. 8.

In the mode illustrated at b, the voltage $M_2$ is purposely made slightly more positive than the voltage $M_1$ during the transfer. This causes the momentary trapping of charge in the shallow potential well beneath the window. However, if the voltage $M_2$ has a relatively slow rise time, that is, if the transition from substrate potential 100 to substrate potential 94a is relatively slow, then only a relatively small amount of charge will become trapped in potential well 94a. In similar fashion, if the fall time of $M_2$ is relatively slow so that the potential well 98 reduces its depth relatively slowly while there is a potential well 96 still present beneath electrode 24, then the charge trapped in well 98 will be pushed from this well and into the potential well 96. It is desirable to remove as much charge as possible from well 94a as any residual charge which remains, tends to degrade the vertical MTF (modulation transfer function) of the imager.

FIG. 8 illustrates at c a second mode of operation. Here, during the transfer the voltage $M_2$ is purposely not driven as positive as the voltage $M_1$ so that a small potential barrier 102 remains beneath the window 26. Because of this barrier, some fixed, steady state charge will be left behind in the shallow potential well 92 beneath electrode portion 22a. In a steady state operation with a bias charge (fat zero), a typical transfer loss for this type of transfer is of the order of $10^{-3}$. However, even without a bias charge, the expected charge transfer loss in this case may be of the order of $10^{-2}$ (1%) and this should have negligible effect on the operation of the system.

Figure 9:
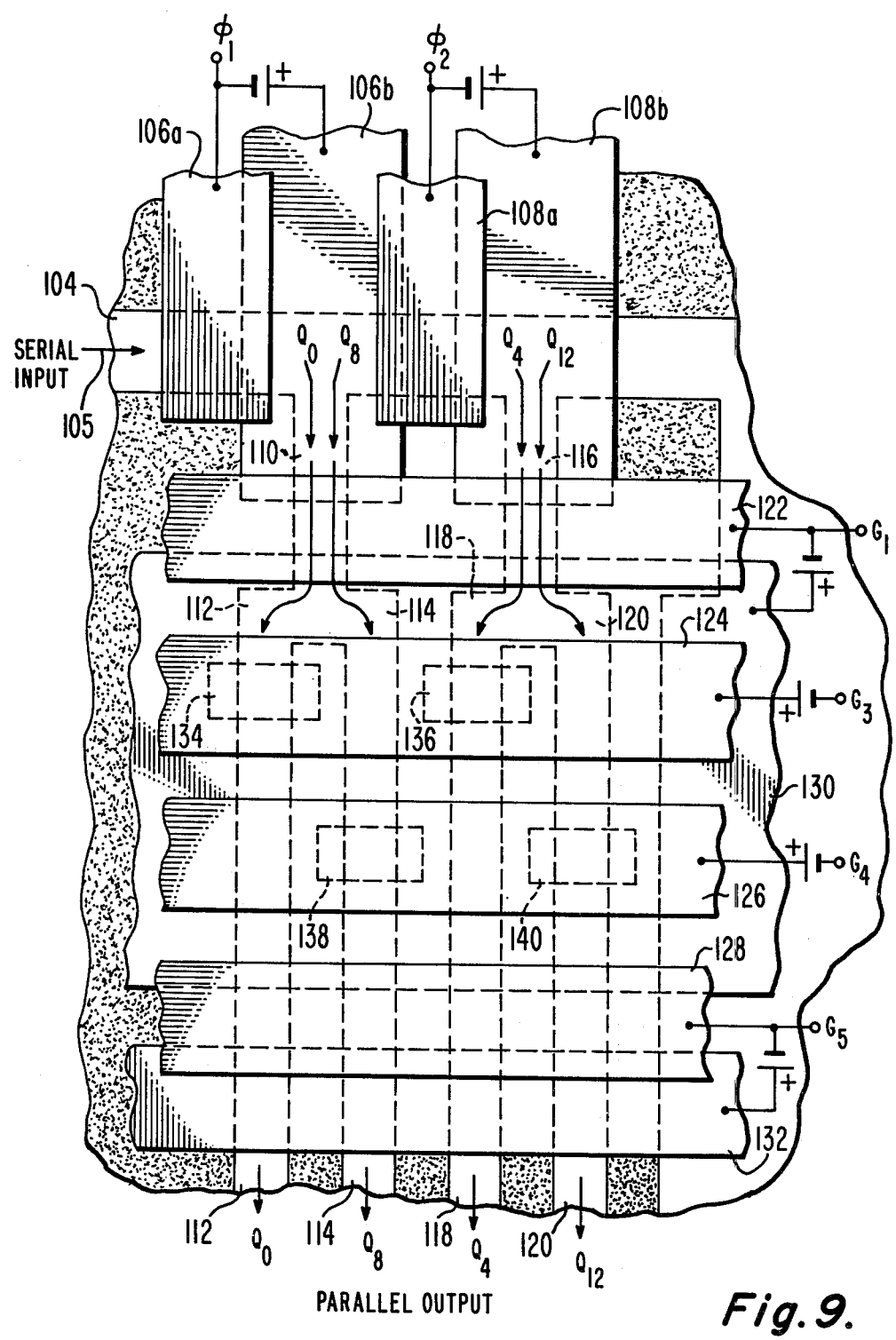
FIG. 9 is a plan view of an embodiment of the invention for translating serially-occurring charges to charges in parallel.

FIG. 9 illustrates an embodiment of the invention which is suitable for serial-to-parallel conversion. The upper part of the figure illustrates one stage of a two-phase CCD register. Charges are propagated serially at relatively high speed down channel 104 in the direction of arrow 105. The one stage illustrated comprises two pairs of electrodes 106a, 106b and 108a, 108b. The storage electrode 106b is coupled to an input channel 110 and channel 110 opens onto two channels 112 and 114. In similar fashion, electrode 108b is coupled to an input channel 116 which leads to two channels 118 and 120, respectively. The flow of charge along channels 112, 114, 118 and 120 is controlled by a group of two-level electrodes. The upper level comprises electrodes 122, 124, 126 and 128 and the lower level comprises electrodes 130 and 132. Electrode 130 is formed with four windows therein, namely 134, 136, 138 and 140. Windows 134 and 136 are located over channels 112 and 118, respectively, and gate electrode 124 controls the substrate potential beneath these windows. Windows 138 and 140 are located over channels 114 and 120, respectively, and the substrate potential beneath these windows is controlled by electrode 126.

In a complete system embodying the invention, the serial input register may be relatively long and capable of storing a large number, such as 100 or more, of charge packets. There is associated with four adjacent stages of this register, four serial-to-parallel converters such as shown in FIG. 9. During the operation, the network shown processes, for example, the zero'th, fourth, eighth, and twelfth charge packet in the serial stream of charges propagating along channel 104. It processes these charges by selecting the charge packets as they propagate to beneath electrode 106b or 108b, as will be discussed, and causing the selected charge packet to propagate down one of the four output channels 112, 114, 118 and 120, respectively. After a charge is selected, it is stored in the network until all four charges are available and then these four charge packets are propagated, in parallel, down the output channels 112, 114, 118, and 120, respectively, via the electrode pair 128, 132. During the time the network shown is processing the charge packet $Q_0$ which occurs in the eighth bit time, the adjacent network to the left (not shown), is processing the $Q_1$ charge packet. The next adjacent network to the left (not shown), is concurrently processing the $Q_2$ charge packet. Accordingly, four networks such as shown can process sixteen serially-occurring signals, four bits at a time. In other words, during sixteen bit times, the total of four networks process sixteen sequential charge packets and these will appear as four groups of four charge packets each, in parallel, at the outputs of the four networks.

Figure 10:
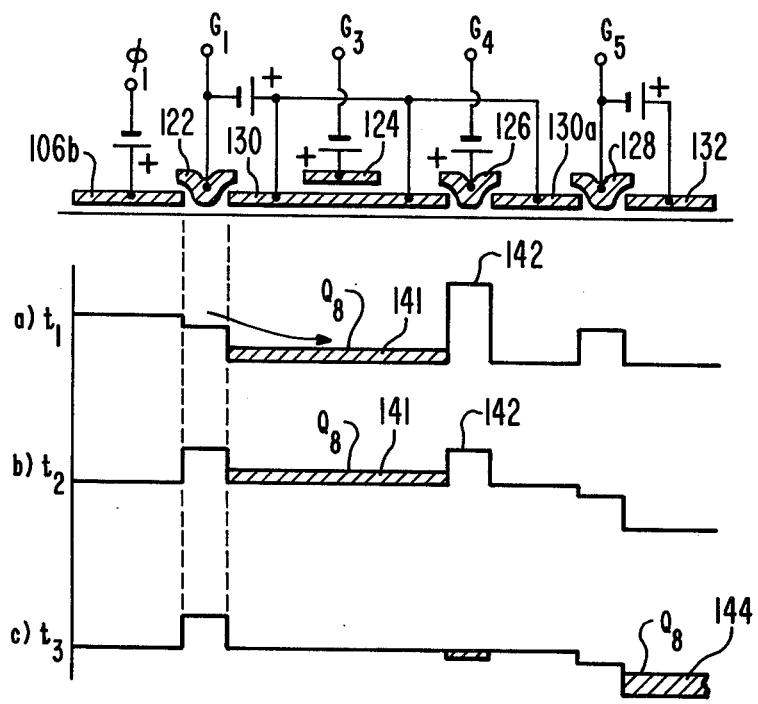
FIGS. 10 and 11 are sections taken through the $Q_3$ charge flow channels and the $Q_1$ charge flow channels, respectively, of the system of FIG. 9 and these figures show also surface potential profiles obtained during the operation of the system of FIG. 9.

In the discussion which follows of the operation of the system, FIGS. 9–12 should be referred to. FIG. 10 illustrates how the $Q_8$ charge packet, which is a charge packet occurring in the zero'th bit time, is processed. The clock pulses $\phi_1$ and $\phi_2$ employed in the operation are non-lapping clock pulses. DC offsets between various electrodes are indicated schematically by the battery symbols. At a time just prior to $t_1$, the $Q_8$ charge arrives beneath storage electrode 106b. Even though the $\phi_1$ clock pulse terminates prior to time $t_1$, the substrate biasing is such that a potential well remains beneath electrode 106b so that the $Q_8$ charge packet remains stored beneath electrode 106b. However, by the time $t_1$, $G_1$ has gone high so that this charge packet has transferred via the conduction channel beneath electrode 122 to the potential well 141 in the substrate beneath electrode 130. A portion of this charge will be in channel 112 and a portion in channel 114 at this time.

At time $t_2$, the voltage $G_1$ is low so that there is a potential barrier present beneath transfer electrode 122. The potential well 141 beneath electrode 130 reduces in depth but the charge $Q_8$ remains stored there. The barrier isolates channel 110 from the serially propagating charges in channel 104.

At time $t_3$, the voltage $G_4$ is high so that the potential barrier 142 is removed. During this time $G_5$ is high so that a potential well 144 is present beneath electrode 132. Accordingly, the charge formerly present in well 140 in channel 114 propagates to the potential well 144 beneath storage electrode 132 in channel 114.

Figure 11:
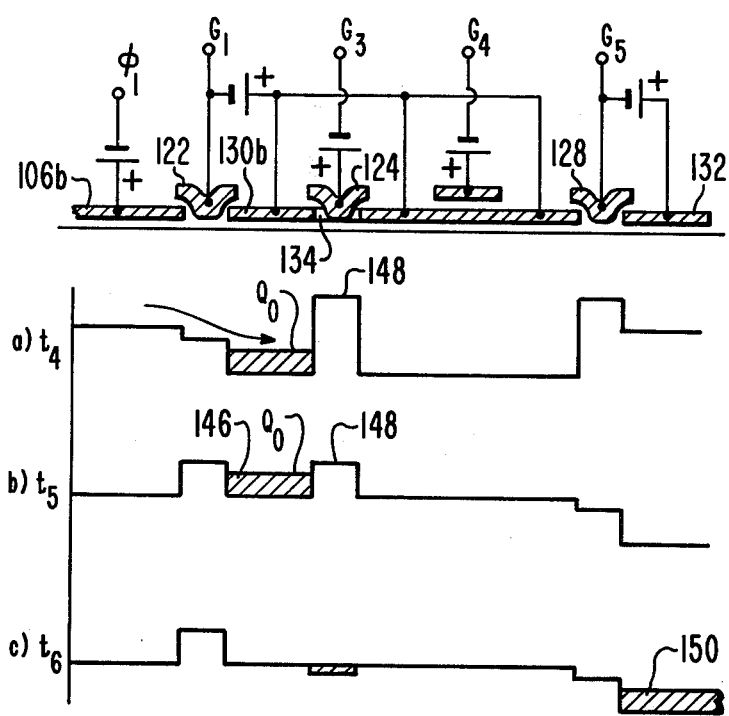
Figure 12:
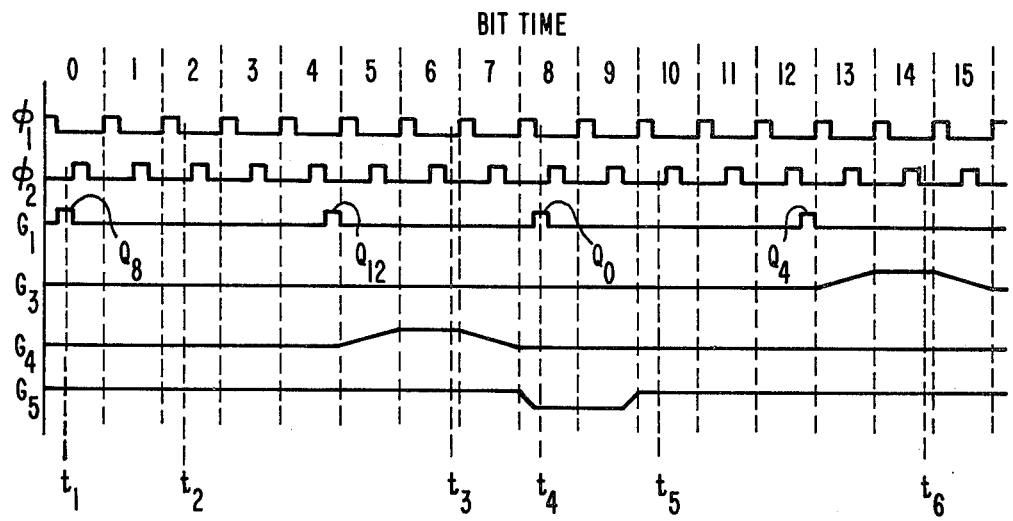
FIG. 12 is a drawing of waveforms employed in the operation of the system of FIGS. 9-11.

FIG. 11 illustrates how the $Q_0$ charge packet, which occurs during bit time 8, is handled. This charge packet arrives under electrode 106b before time $t_4$. At time $t_4$, $G_1$ goes high causing the transfer of the $Q_0$ charge packet to beneath electrode 130 in both channels 112 and 114. At this time $G_5$ is low so that there is a barrier beneath electrode 128. At time $t_5$, $G_3$ is also low so that there is a barrier beneath electrode 124, that is, there is a potential barrier created in channel 112 through window 134. Thus, the $Q_0$ charge becomes stored under portion 130b of electrode 130, that is, it becomes stored in potential well 146. At time $t_6$, $G_3$ is high so that the potential barrier 148 is no longer present. Therefore, the charge in potential well 146 in channel 112 spills out of this potential well and passes into the potential well 150 which is now present beneath storage electrode 132 in channel 112.

What has just been described is the processing of the charge packets which are legended $Q_8$ and $Q_0$, and which occur in the zero'th and eighth bit times, respectively. These charge packets become stored in channels 112 and 114 beneath electrode 132 during one period (16 bit times) of operation. The charge packets, $Q_2$ and $Q_4$, respectively, are handled in similar fashion but via input channel 116. For example, the charge packet $Q_{12}$ arrives beneath electrode 108b during bit time 4 and $\phi_2$ is positive. Shortly thereafter, $G_1$ goes high to transfer the charge packet $Q_{12}$ to beneath electrode 130. If the operation is traced it will be seen that the $Q_{12}$ charge packet will end up in channel 120 stored beneath electrode 130. It can also be shown that the $Q_4$ charge packet, which arrives beneath electrode 108b during bit time 12, becomes stored beneath electrode 132 in channel 118.

During one portion of an operating period, namely during the bit times 8 and 9, the four charge packets, which prior to that time have become stored beneath electrode 132, are propagated, in parallel, to the potential wells beneath the following electrode (not shown). This propagation is accomplished by changing the voltage $G_5$ to a less positive value while the voltage applied to the following electrode pair (not shown) is made more positive, in the usual way.

Summarizing the operation of the embodiment of FIG. 9, while a serial bit stream is being shifted along input register 104, the network shown picks out the zero'th, fourth, eighth and twelfth charge packets. The network steers these charge packets $Q_8$, $Q_{12}$, $Q_0$ and $Q_4$ into channels 114, 120, 112 and 118, respectively, and during bit times 8 and 9, these charge packets propagate, in parallel, to the potential wells beneath the following electrode pair (not shown). The three other networks, not shown, do the same thing to the three other groups of four bits each interleaved with the bits just discussed. For example, the preceding network handles the bits $Q_1$, $Q_5$, $Q_9$ and $Q_{13}$ and so on.

Figure 13:
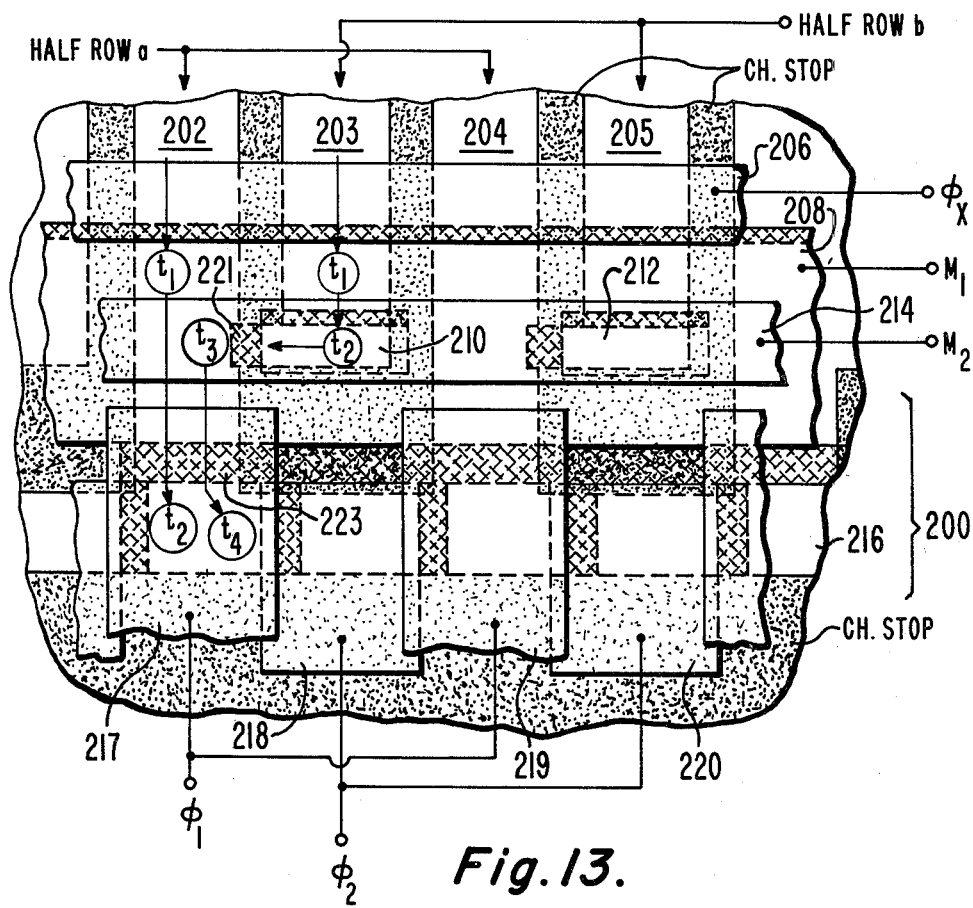
FIG. 13 is a plan view of an embodiment of the invention which is useful for the readout of a high-density CCD memory.

FIG. 13 illustrates an embodiment of the invention which is useful for a serial-parallel-serial (SPS) memory. What is illustrated is a portion of the last row of the memory, the serial output register 200 of the memory and the gating structure between the memory matrix and the output register. This gating structure permits the readout of half row a of the memory consisting of charge packets in alternate columns of the memory followed by readout of the remaining half row b of the memory, where the columns of b are interleaved with the columns of a.

Assume to start with that charge packets are present in channels 202, 203, 204 and 205 of the memory and the last row of said such charge packets is stored beneath electrode 206. The gating structure comprises electrode 208 which is formed with windows 210 and 212. The substrate potential beneath these windows is controlled by electrode 214. The serial output register comprises channel 216 and the two-phase electrodes 217, 218, 219 and 220 are located over the channel. For purpose of the present discussion, it is assumed that doped regions, where indicated, are employed to provide asymmetrical potential wells required for unidirectional signal propagation.

In operation, at time $t_1$, $\phi_x$ is made less positive and $M_1$ is driven more positive to effect the transfer of charge from the potential wells beneath electrode 206 to the potential wells beneath electrode 208. Only channels 202 and 203 will be considered in this discussion, it being understood that the charges in channels 204 and 205 behave in an analogous manner. At time $t_2$, the $\phi_1$ electrode 217 goes relatively positive and $M_1$ goes less positive so that the charge packet in channel 202 travels to the potential well in channel 216 beneath the $\phi_1$ electrode 217.

At time $t_1$, potential $M_2$ is relatively negative so that a potential barrier is present beneath window 210. Therefore, the charge packet in channel 203 remains stored beneath electrode 208, above the window as viewed in FIG. 13. At time $t_2$, $M_2$ goes positive so the charge in channel 203 becomes stored beneath the window 210. $M_1$ goes less positive at time $t_2$, as already mentioned.

After the operation just discussed, the multiple-phase voltages shift the charge packet from column 202 and the corresponding charge packets from column 204 and corresponding alternate columns out of the output register 200, at high speed. Thereafter, at time $t_3$, $M_2$ is made relatively negative while $M_1$ is made relatively positive. When $M_1$ is made relatively positive, a potential well is created in channel 202 beneath electrode 208 and the charge formerly present beneath window 210 moves into this potential well. Note that there is an implanted barrier at 221 beyond the left edge of window 210. This barrier 221 is effectively at the lagging edge of the potential well created when electrode 208 is driven relatively positive so that unidirectional charge flow from the potential well in channel 203 beneath window 210 to the potential well in channel 202 beneath electrode 208 is assured.

At time $t_4$, $M_1$ is driven less positive while $\phi_1$ goes positive. This causes the charge stored beneath electrode 208 in channel 202 to transfer to the storage potential well beneath electrode 217 via implanted barrier 223. Concurrently, the same thing is occurring for the alternate charge packets which originated in the remaining columns such as 205 which make up half row b. These charge packets subsequently are shifted out of the output register 200 in response to the application of multiple-phase voltages. Note that in this output register as there are implanted barriers at the lagging edges of the electrodes, only one electrode is needed per phase. In other words, charge can be stored at alternate electrodes such as 217 and 219.

An advantage of the arrangement of FIG. 13 is that the columns can be closely packed, that is, high storage capacity is possible. The columns can be closely packed as it is possible with this arrangement, to align a half stage of the output register with each column. The use of the arrangement shown permits the half row a to be shifted into the storage wells of the output register 200 while the half row b is temporarily stored. It then permits the half row b which is temporarily stored, to be shifted into the columns formerly occupied by the half row a and from there to the storage potential wells of the output register.

Figure 14:
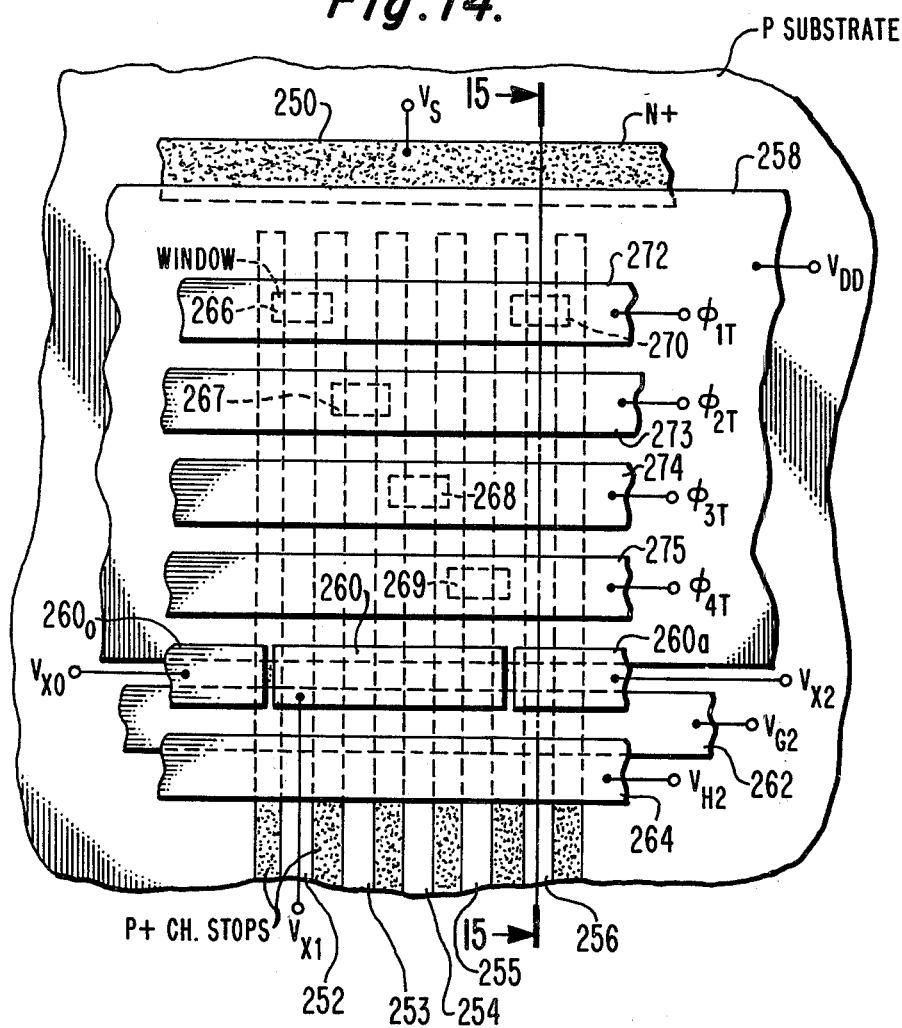
FIG. 14 is a plan view of a multiplexer embodying the invention.

The embodiment of the invention illustrated in FIG. 14 is suitable for providing input charge packets to a CCD memory. These packets are supplies as sequential groups of four charge packets and a large number of such groups may be concurrently generated.

Referring first to FIG. 14, the structure includes a P-type substrate and an N+ source diffusion 250 in the substrate which is common to all of the CCD channels. A number of such channels are shown at 252–256, respectively, and they are separated from one another by P+ channel stops. A large electrode 258 is located over the input end of the channels and extends between the source region 250 and groups of "fill and spill" or "metering" gates. Each group of gates such as 260, 262 and 264 is located over four CCD channels. The large electrode 258 is formed with a plurality of windows therein, one over each channel, five of which are shown at 266–270, respectively. Gate electrodes 272–275, respectively, extend in the row direction and each gate electrode controls the potential of the substrate beneath a row of windows.

The operation of the CCD of FIG. 14 will be discussed in connection with FIG. 15 which shows the surface potential profiles during such operation. The function of the large gate 258 is to create an MOS inversion layer so that there is a conduction channel between the source diffusion 250 and the metering gates except in the regions where the row conductors create a potential barrier in the window regions as discussed shortly. This large electrode 258 is maintained at a positive DC level $V_{DD}$. The source electrode 250, during some periods of operation, is placed at a relatively negative potential $V_S$ so that it acts as a source of charge carriers (electrons) and during other periods of operation, is placed at a relatively positive potential $V_S$ so that it acts as a drain for electrons. The multiple-phase voltages $\phi 1T$–$\phi 4T$ are made relatively positive, in sequence, only one such potential being positive at a time. In other words, in each group of four CCD channels there are barriers created through the windows in three of the channels and a conduction channel is created through the window in the remaining channel, at one particular time.

Figure 15:
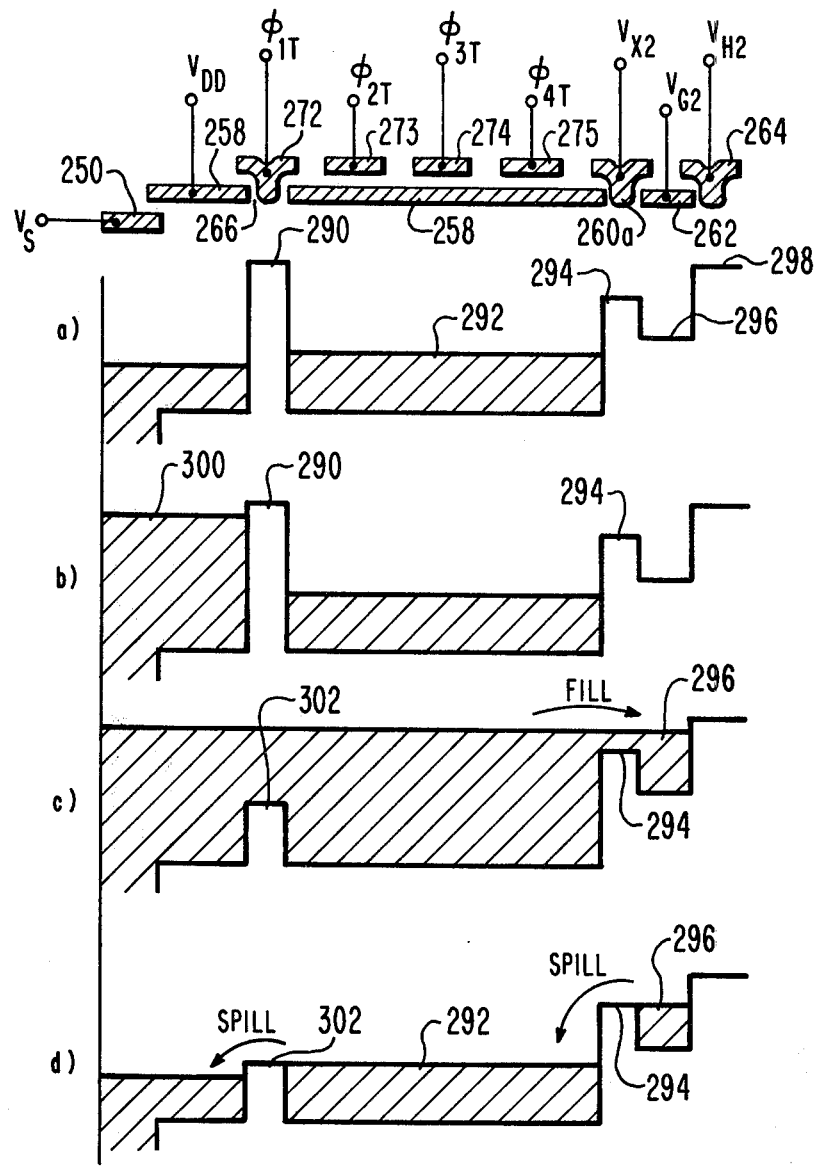
FIG. 15 shows surface potential profiles which illustrate the operation of FIG. 14.

Referring now to FIG. 15, surface potential profile a depicts the situation in a channel (channel 256 is chosen by way of illustration) when $V_S$ is relatively positive so that the region 250 is acting as a drain and $\phi 1T$ is relatively negative so that there is a potential barrier 290 created in the substrate region beneath window 266. There is a potential well 292 present beneath the major part of electrode 258 and it includes some bias charge. How this charge is obtained will be discussed shortly. $V_{X2}$ may be considered the signal potential and as will be clear from the discussion which follows, this signal potential represents a 1 and creates a potential barrier 294 which is lower than the potential barrier 290. $V_{G2}$ is relatively positive and creates a potential well 296. $V_{H2}$ is relatively negative and creates a potential barrier 298.

At a following time period illustrated in b in FIG. 15, the source potential $V_S$ is made relatively negative so that it acts as a source of charge carriers. At this particular time there may be a channel in the group of four other than the one whose surface potential is illustrated in FIG. 15 where there is a conduction channel present beneath a window. However, in channel 256 illustrated, $\phi 1T$ happens to be relatively negative so that the potential barrier 290 is present and none of the charge 300 passes over this barrier.

At a later period in the cycling of the multiple-phase voltages, $\phi 1T$ goes positive reducing the height of the potential barrier beneath electrode 272 so that the barrier is as shown at 302 potential profile c. The charge carriers (electrons) now pass from the source 250 through the conduction path beneath the remainder of electrode 258 and overfill the potential well 296 as shown. During a following time period illustrated at d in FIG. 15, the potential $V_S$ is made more positive so that the region 250 operates as a drain. The potential $\phi 1T$ remains at its previous value so that the barrier height beneath the window 266 remains as shown at 302. The excess charge carriers now spill from well 296 and pass through the potential well 292 and back to the diffusion 250 which is now operating as a drain. Thus, what has just been described is a fill and spill operation for producing a low-noise charge packet in well 296 at a level which represents the signal level $V_{X2}$. As already mentioned, this charge packet represents a 1. To represent a 0, the signal $V_{X2}$ level can be made less positive so that the potential barrier 294 will be substantially higher (for example, at the same level as the potential barrier 290) so that during the fill portion of the cycle, no charge will enter well 296. Alternatively, a zero level can be represented by a more positive voltage $V_{X2}$ than a one level, so that during the spill portion of the cycle either all of the charge in well 296 can be removed from that well or, if desired, the height of barrier 294 can be such that a small amount of bias charge known as a "fat zero" remains in well 296.

At a subsequent period of time, not illustrated, voltage $V_{H2}$ is made more positive and the voltage of a following storage electrode, not illustrated, is also made more positive. This causes the charge in well 296 to propagate, in usual CCD fashion, to beneath the following storage electrode. Additional CCD electrodes, not illustrated, controlled by multiple-phase voltages are employed to continue to propagate the "metered" charge down the CCD channel.

It may be observed in surface potential profile d that a bias charge remains in potential well 292. This bias charge does not propagate down the CCD channel and always is present. It is advantageous to operate in this way as the bias charge reduces losses which would otherwise occur due to surface traps in a surface channel CCD.

What has just been described is the creation of one charge packet in one CCD channel. During the creation of a charge packet in channel 256, there is concurrently-produced a charge packet in channel 252 under the control of electrodes 272, 260, 262 and 264 and there is also concurrently-produced a charge packet in every corresponding channel of the other groups of four channels. In one particular design it was intended that 256 charge packets be produced at a time and there were 256 groups of four CCD channels each. After the production of the first group of charge packets as just discussed, there is then produced during a following time period when $\phi 2T$ goes high and $\phi 1T$, $\phi 3T$ and $\phi 4T$ are all low, a charge packet in channel 253 and in each fourth channel corresponding to 253. The process continues until there is generated for each group of four channels, four sequential charge packets. In this particular example, each charge packet represents a binary value, that is, a 1 or a 0. However, it is to be understood that $V_{X0}$, $V_{X1}$ and so on can represent analog values, if desired, as may be required, for example, for the storage of video information for subsequent display on a cathode ray tube.

Figure 16:
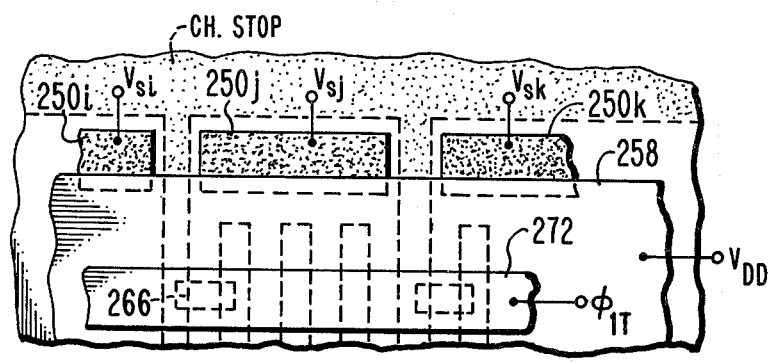
FIG. 16 is a plan view of a portion of a modified form of multiplexer, similar in many respects to the one of FIG. 14.

An alternative form of system is shown, in part, in FIG. 16. Here there are separate sources 250i, 250j, 250k, for each group of four channels, each controlled by a separate source voltage $S_i$, $S_j$ and $S_k$, respectively. These voltages represent data inputs. In this embodiment the three electrodes $260_0$, 260 and $260_a$ are replaced by a single electrode controlled by a strobe pulse, call it $V_X$. In other respects, the structure is similar to FIG. 14.

In operation, a charge packet is introduced into a group of four channels by applying a $V_S$ pulse while applying a strobe pulse $V_X$, and while concurrently creating a conduction path beneath one window. After the introduction of a charge packet, the source voltage $V_S$ is returned to a relatively positive level before the gate electrode (such as 272) is turned off (so as to achieve the operation depicted at d) in FIG. 15. By separately controlling the values of $V_{Si}$, $V_{Sj}$, $V_{Sk}$ and so on, charge packets concurrently may be introduced into each group of four channels. In the example previously given of 256 groups of four channels each, 256 charge packets may be introduced at a time.

What is claimed is:

1. A charge-coupled device (CCD) comprising:
   a semiconductor substrate formed with first and second CCD channels therein, said channels being defined by potential barriers in said substrate;
   a first gate electrode insulated from the substrate and extending over both channels, said electrode being formed with an opening therein over said first channel;
   a second gate electrode located over said opening for controlling the substrate potential of said first channel through said opening, said second gate electrode being shielded from said second channel by said first gate electrode;
   means for applying a bilevel control voltage to said second gate electrode, one of said levels creating a potential barrier in said first channel through said opening in said first gate electrode for preventing the passage of charge in said first channel past said opening, and the other of said levels creating a potential well in said first channel through said opening in said first gate electrode for the storage of charge in the substrate region adjacent to said opening;
   a second opening in said first gate electrode, said second opening being over said second channel;
   a third gate electrode over said second opening for controlling the substrate potential of said second channel through said second opening, said third gate electrode being shielded from said first channel by said first gate electrode; and
   means for applying a bilevel control voltage to said third gate electrode, one of said levels creating a potential barrier in said second channel through said second opening in said first gate electrode for preventing the passage of charge in said second channel past said second opening, and the other of said levels creating a potential well in said second channel through said second opening in said first gate electrode for the storage of charge in the substrate region of said second channel adjacent to said second opening.

2. A CCD as set forth in claim 1, further including:
   a common CCD input channel joined to said first and seconc channels;
   means for propagating charge signals, in sequence, down said common CCD input channel to said first and second channels;
   an output electrode adjacent to the edge over said first and second channels and furthest from said common CCD input channel of said first gate electrode, said first and second channels extending beneath said output electrode;
   means for applying a control voltage to said output electrode of a sense to form storage potential wells in said first and second channels; and
   means for applying levels of control voltages to said first gate electrode and for concurrently manipulating the voltages applied to said second and third gate electrodes for steering sequential charge signals into desired ones of said first and second channels and for propagating said charge signals to said storage potential wells.

3. A CCD as set forth in claim 2, further including:
   a multiple phase serial CCD register, said common input channel being coupled to one of the stages of said register; and wherein:
   said means for propagating charge signals comprises gate electrode means coupled to said common CCD channel, and means for applying a control voltage to said gate electrode means for selecting and propagating a charge signal from said register down said common input channel.

4. A charge-coupled device (CCD) comprising:
   a semiconductor substrate formed with a plurality of parallel channels therein defined by potential barriers at the opposite edges of each channel, said channels extending in a column direction, the columns of channels being arranged in M groups, with N channels in each group, M and N being integers greater than 1;
   a first electrode insulated from said substrate and extending over said channels, said electrode being formed with N rows of windows therein, each row of windows comprising M windows, each window in a row being located over the j'th channel in a group of channels, where j is an integer in the range 1–N, and j being a different value for each row, said electrode for controlling the channel potentials in regions thereof adjacent to said electrode except where the windows are present, in response to a potential applied to said electrode;
   N electrodes, each insulated from said first electrode, each extending in a row direction orthogonal to said column direction, each electrode being located over a different row of windows, each electrode for controlling the substrate potential beneath a row of windows in response to a voltage supplied to that electrode; and
   means for introducing charge packets into the respective channels.

5. A CCD as set forth in claim 4, wherein said means for introducing charge packets comprises a region of the substrate of opposite conductivity that the substrate which extends in the row direction and is common to all of said channels, and means for controlling the potential of said region.

6. A CCD as set forth in claim 4, wherein said means for introducing charge packets comprises a CCD register having multiple output ports to which charge packets in said register are propagated and from which such packets may be transferred, and electrode means responsive to applied voltages for transferring charge packets from said output ports to said channels.

7. A CCD as set forth in claim 4, further including means for introducing and for maintaining a bias charge in a region of each channel beneath said first electrode.

8. A CCD as set forth in claim 4, wherein said means for introducing charge packets comprises M groups of separate regions, each such region comprising a region of the substrate of opposite conductivity than the substrate which extends in the row direction and is common to a group of N channels, and means for separately controlling the potentials of said regions.

9. A CCD as set forth in claim 5, wherein said means for controlling the potential of said region comprises means for supplying a first potential to said region such that it operates as a source of charge carries and for applying a second potential to said region such that it operates as a drain for charge carriers.

10. A CCD as set forth in claim 9, further including means for creating in a plurality of said channels in a region of the substrate adjacent to an edge of said first electrode opposite to the region of said first electrode where said region of the substrate of opposite conductivity than the substrate is located, means responsive to a signal potential for creating a barrier between said potential well and the portion of said channels beneath said first electrode whereby during the time said region of the substrate is operating as a source of charge carriers, said potential well overfills and when said region of said substrate is operating as a drain for charge carriers, some of said charge carriers spill out of said potential well and return to said drain.

11. A charge-coupled device (CCD) comprising:
a semiconductor substrate formed with first and second CCD channels therein, said channels being defined by potential barriers in said substrate;
a first gate electrode insulated from the substrate and extending over both channels, said electrode having first and second opposite edges extending over both channels, said electrode being formed with a window therein between and spaced by electrode material from said opposite edges, and said window being over said first channel;
a second gate electrode located over said window for controlling the substrate potential of said first channel through said window, said second gate electrode lying within the opposite edges of the first gate electrode and being shielded from said second channel by said first gate electrode; and
means for applying a bilevel control voltage to said second gate electrode, one of said levels creating a potential barrier in said first channel through said window in said first gate electrode for preventing the passage of charge in said first channel past said window, and the other of said levels creating a potential well in said first channel through said window in said first gate electrode for the storage of charge in the substrate region adjacent to said window.

12. A CCD as set forth in claim 11, further including:
a common CCD output channel in said substrate joined to said first and second channels; and
output electrode means adjacent to the edge closest to said common CCD output channel of said first gate electrode, and over said common CCD output channel for propagating charge from the first and second channels to said common CCD output channel.

13. A CCD as set forth in claim 12, further including:
means for concurrently propagating charge signals along said first and second channels to substrate regions adjacent to said first gate electrode; and
means for applying control voltages to said first and second gate electrodes and to said output electrode means of values to first shift the charge in said second channel to said common output channel and to then shift the charge in said first channel to said common output channel.

14. A CCD as set forth in claim 13, wherein said means for applying control voltages comprises, during a first time period, means for applying a voltage level to said second gate electrode for creating a potential barrier in said first channel through said opening in said first electrode for preventing the passage of charge in said first channel while applying voltages to said first gate electrode and to said output electrode means which cause the transfer of charge from said second channel to a substrate region beyond said first gate electrode and which is controlled by said output electrode means, and during a second time period, following the first, means for applying a voltage level to said second gate electrode for creating a potential well in said first channel through said opening in said first gate electrode, for storing the charge in said first channel, and for then applying voltage levels to said first and second gate electrodes and to said output electrode means which cause the transfer of said charge from said potential well in said first channel to a substrate region beyond said first gate electrode and which is controlled by said output electrode means.

15. A charge-coupled device (CCD) comprising:
a semiconductor substrate formed with first and second CCD channels therein, said channels being defined by potential barriers in said substrate;
a first gate electrode insulated from the substrate and extending over both channels, said electrode being formed with an opening wherein over said first channel;
a second gate electrode located over said opening for controlling the substrate potential of said first channel through said opening, said second gate electrode being shielded from said second channel by said first gate electrode;
means for applying a bilevel control voltage to said second gate electrode, one of said levels creating a potential barrier in said first channel through said opening in said first gate electrode for preventing the passage of charge in said first channel past said opening, and the other of said levels creating a potential well in said first channel through said opening in said first gate electrode for the storage of charge in the substrate region adjacent to said opening; and
means for propagating any charge stored in said potential well beneath said opening to a region of said first channel beneath said first gate electrode.

16. A CCD as set forth in claim 15, further including:
an output electrode adjacent to an edge over said first and second channels and furthest from said common CCD input channel of said first gate electrode, said second channel extending under said output electrode; and
means for applying control voltages to said first and second gate electrodes and to said output electrode of values to first shift the charge in said second channel to a region of the second channel controlled by said output electrode, and to then shift the charge from said first channel via a storage well created beneath said opening to a region of said second channel controlled by said first gate electrode and thence to a region of said second channel controlled by said output electrode.

* * * * *

UNITED STATES PATENT AND TRADEMARK OFFICE
CERTIFICATE OF CORRECTION

PATENT NO. : 4,211,936
DATED : July 8, 1980
INVENTOR(S) : Walter F. Kosonocky et al.

It is certified that error appears in the above-identified patent and that said Letters Patent is hereby corrected as shown below:

Column 1, line 6, "contact" should be --contract--.

Column 2, line 11, "by" should be --of--.

Column 3, line 24, "propagaton" should be --propagation--.

Column 3, line 26, "is" should be --it--.

Column 11, line 55, (claim 2), "seconc" should be --second--.

Column 12, line 40, (claim 4), "supplied" should be --applied--.

Column 12, line 46, (claim 5), "that" should be --than--.

Column 13, line 2, (claim 9), "carries" should be --carriers--.

Column 14, line 29, (claim 15), "wherein" should be --therein--.

Signed and Sealed this

Twenty-third Day of September 1980

[SEAL]

Attest:

SIDNEY A. DIAMOND

*Attesting Officer*   *Commissioner of Patents and Trademarks*